United States Patent
Hung et al.

(10) Patent No.: US 8,802,521 B1
(45) Date of Patent: Aug. 12, 2014

(54) SEMICONDUCTOR FIN-SHAPED STRUCTURE AND MANUFACTURING PROCESS THEREOF

(71) Applicant: United Microelectronics Corp., Hsin-Chu (TW)

(72) Inventors: Ching-Wen Hung, Tainan (TW); Chih-Sen Huang, Tainan (TW); Shih-Fang Hong, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/909,101

(22) Filed: Jun. 4, 2013

(51) Int. Cl.
*H01L 21/336* (2006.01)
*H01L 29/06* (2006.01)
*H01L 21/762* (2006.01)

(52) U.S. Cl.
CPC ...... *H01L 21/76229* (2013.01); *H01L 29/0649* (2013.01)
USPC .......................................... 438/197; 257/347

(58) Field of Classification Search
CPC ............ H01L 29/66795; H01L 29/785; H01L 21/823807; H01L 21/845; H01L 29/66545; H01L 29/7851; H01L 29/66636; H01L 29/66818; H01L 21/823821
USPC .......................................... 257/347; 438/197
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |

(Continued)

OTHER PUBLICATIONS

Tsao, Title of Invention:Method of Forming Fin-Shaped Structure, U.S. Appl. No. 13/902,970, filed May 27, 2013.

*Primary Examiner* — Zandra Smith
*Assistant Examiner* — Paul Patton
(74) *Attorney, Agent, or Firm* — Winston Hsu; Scott Margo

(57) ABSTRACT

The present invention provides a method for forming a fin structure comprising the following steps: first, a substrate is provided and a plurality of fin structures, a plurality of first dummy fin structures and a plurality of second dummy fin structures are formed on the substrate; a first patterned photoresist is used as a hard mask to perform a first etching process to remove each first dummy fin structure; then a second patterned photoresist is used as a hard mask to perform a second etching process to remove each second dummy fin structure, wherein the pattern density of the first patterned photoresist is higher than the pattern density of the second patterned.

16 Claims, 6 Drawing Sheets

(56) References Cited

U.S. PATENT DOCUMENTS

| | | |
|---|---|---|
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2013/0330889 A1 * | 12/2013 | Yin et al. ............ 438/197 |

* cited by examiner

SEMICONDUCTOR FIN-SHAPED STRUCTURE AND MANUFACTURING PROCESS THEREOF

BACKGROUND OF THE INVENTION

1. Field of the Invention

The present invention relates to semiconductor manufacturing process, and more particularly to a method for improving the precision when removing the fin structures.

2. Description of the Prior Art

With the trend in the industry being towards scaling down the size of the metal oxide semiconductor transistors (MOS), the three-dimensional or non-planar transistor technology, such as the fin field effect transistor technology (Fin FET), has been developed to replace planar MOS transistors.

However, as the size of the FETs shrink, the electrical and physical requirements in each part of the multi-gate FET become critical, like the sizes and shapes of the fin-shaped structures and the spacing between each fin-shaped structure for example. Thus, how to reach standard requirements and overcome the physical limitations has become an important issue in the industry of the FETs.

In conventional processes, if a plurality of fin structures is disposed on a substrate, and the interval between each fin structure is small, when a photo-etching process is performed only once to remove some fin structures, since the density of fin structures between different regions (including the isolated region and the dense region) on the substrate is different, a precise positioning process is needed to etch some fin structures, so as to keep the required fin structures, which requires additional effort and time.

SUMMARY OF THE INVENTION

The present invention provides a method for forming a fin structure comprising the following steps: first, a substrate is provided, and a plurality of fin structures, a plurality of first dummy fin structures and a plurality of second dummy fin structures are formed on the substrate; a first patterned photoresist is used as a hard mask to perform a first etching process and to remove each first dummy fin structure; afterwards, a second patterned photoresist is used as a hard mask to perform a second etching process and to remove each second dummy fin structure, wherein the pattern density of the first patterned photoresist is higher than the pattern density of the second patterned.

The present invention further provides a fin structure comprising: a long thin fin structure, a short wide fin structure disposed between the long thin fin structure and a substrate, a first isolating layer disposed on the side of the short wide fin structure and a second isolating layer disposed between the long thin fin structure and the first isolating layer, which is disposed on the short wide fin structure.

The method of the present invention uses two different etching processes to remove parts of the fin structures. After the first etching process is performed, the density of fin structures on the substrate has lowered, therefore, the required fin structures can be kept precisely after the second etching process is performed, thereby reducing the complexity of the process, and avoiding the method the need for a lot of effort on the positioning process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Please refer to FIGS. 1~11. FIGS. 1-11 are schematic, cross-sectional diagrams showing a method for forming a fin structure according to the first preferred embodiment of the present invention.

Figure 1:
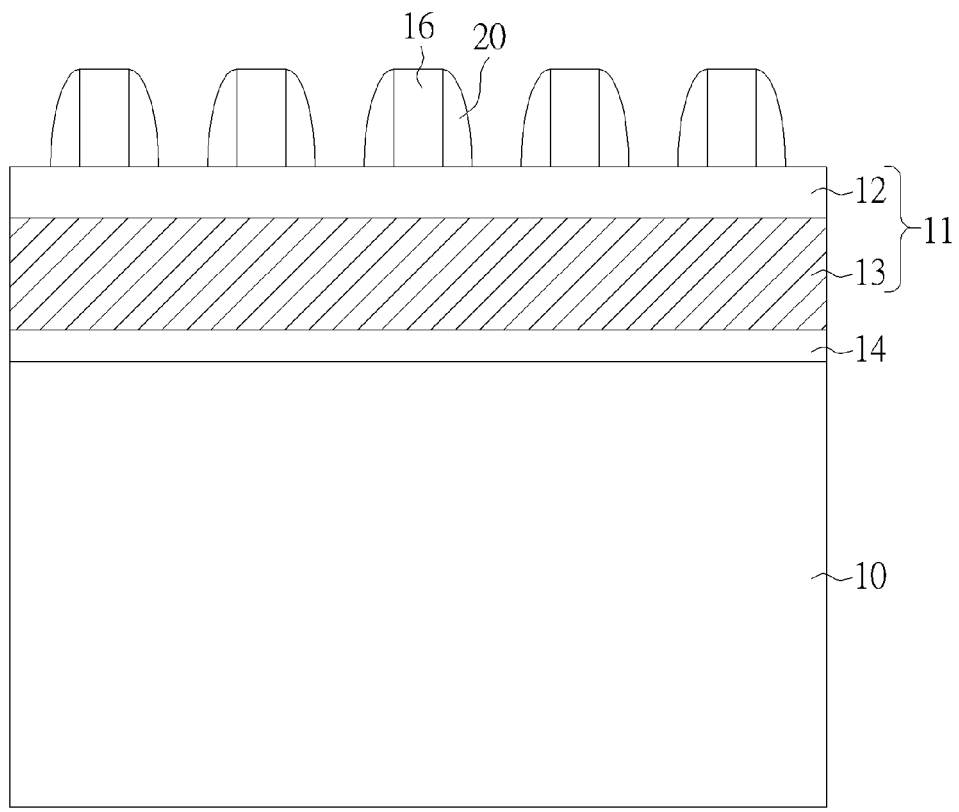
FIGS. 1-11 are schematic, cross-sectional diagrams showing a method for forming a fin structure according to the first preferred embodiment of the present invention.

As shown in FIG. 1, a substrate 10 is provided, such as a bulk silicon substrate; then, a multiple layer structure 11 is formed on the substrate 10 as a hard mask, wherein the multiple layer structure 11 includes at least two materials. In this embodiment, the multiple layer structure 11 includes a top layer 12 and a bottom layer 13, which are formed through a regular deposition process. Besides, a buffer layer 14 may be selectively formed between the multiple layer structure 11 and the substrate 10, wherein the buffer layer 14 not only serves as a hard mask in the following pattern transfer process but is also used as a protective layer to protect the substrate 10 from unwanted damages. It is worth noting that each material comprised in the multiple layer structure 11 has a different etching selectivity to each other. For example, in this embodiment, the top layer 12 is silicon oxide, and the bottom layer 13 is silicon nitride; the etching rates of those two materials are different during etching processes. Besides, a buffer layer 14 is selectively formed and disposed between the multiple layer structure 11 and the substrate 10, which has a different etching selectivity from the adjacent bottom layer 13.

As shown in FIG. 1, at least one sacrificial gate 16 is formed on the multiple layer structure 11, which comprises a material having a different etching selectivity from the multiple layer structure 11. In this embodiment, the material of the sacrificial gate 16 is preferably chosen to be amorphous silicon or poly silicon, which are easier to be removed during following etching processes, but not limited thereto; other suitable materials can also be selected as the material of the sacrificial gate 16. Then, at least a material layer (not shown) is formed to cover each sacrificial gate 16. The material layer may be selected to be a material having a different etching rate from that of the sacrificial gate 16, such as silicon nitride, silicon oxide, silicon oxynitride, silicon carbide or the likes. In the present embodiment silicon nitride is selected as the material, but it is not limited thereto. An etching process is then performed on the material layer, such as a plasma process, to form a plurality of "sail-shaped" spacers 20 on the sidewall of each sacrificial gate 16. In this embodiment, the spacers comprise silicon nitride, but not limited thereto. Besides, the size of each component can be adjusted according to actual requirement.

Figure 2:
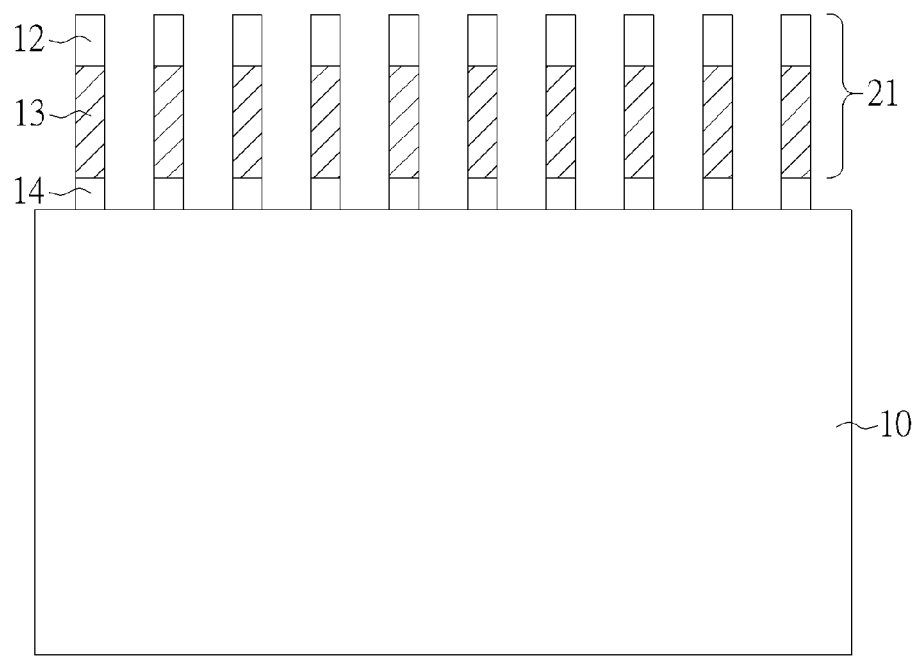
Figure 3:
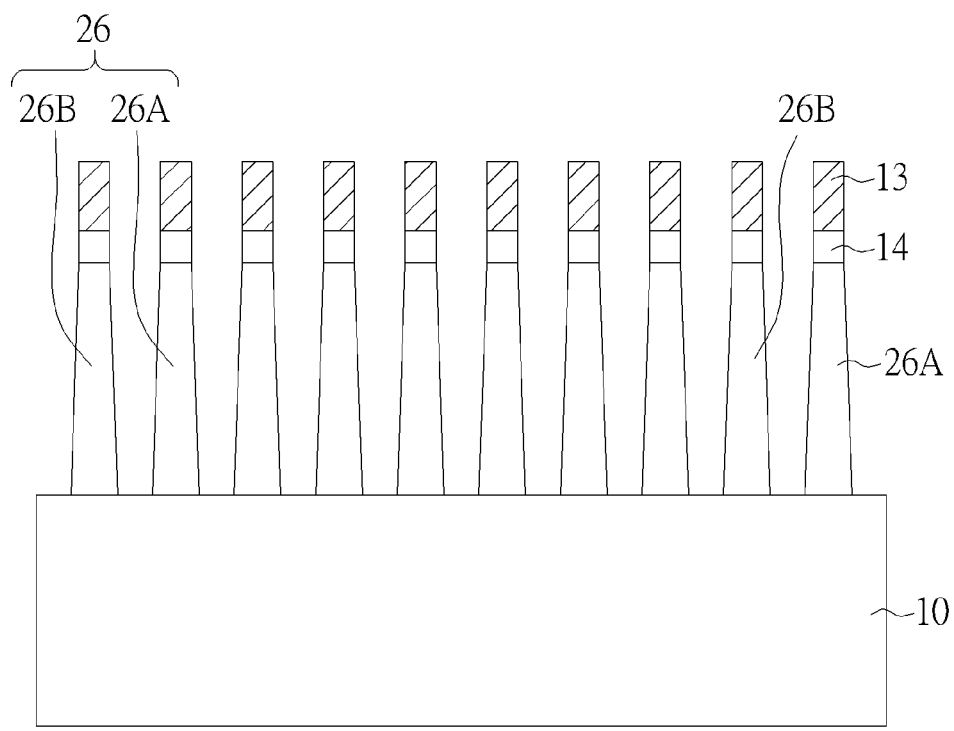

As shown in FIGS. 2~3. The sacrificial gate 16 is entirely removed, the rest of the spacers 20 is used as a mask, and a pattern transfer process is performed on the multiple layer structure 11 to transfer the pattern of the spacers 20 to the multiple layer structure 11 and to form a plurality of corresponding patterned multiple layer structures 21. It should be noted that the pattern transfer process may include a plurality of etching processes and a corresponding preferred embodiment is described as follows. First, the sacrificial gate 16 is completely removed through a regular etching process, such as dry etching or wet etching process, so that only the spacers 20 remain on the multiple layer structure 11. During this etching process, since the etching rate of the sacrificial gate 16 is higher than that of the spacers 20, only parts or even nothing of the spacers 20 are etched away. Then, by using the spacers 20 as a mask, one or more than one anisotropic etching processes are carried out to sequentially etch down the multiple layer structure 11 and the buffer layer 14. At this time, the patterns defined by the spacers 20 can be transferred to the multiple layer structure 11 and the buffer layer 14. Besides, since many etching processes are performed, by the time the bottom layer 13 or the buffer layer 14 is to be etched, the sail-shape spacers 20 may have been etched away or completely removed. It is worth noting that, the "the pattern transfer process" also includes the concepts of the "sidewall image transfer (SIT) process"; in other words, the "pattern transfer process" can be deemed as a superordinate concept of the "sidewall image transfer process".

Afterwards, the patterned multiple layer structures 21 is used as a hard mask, to perform another SIT process that transfers the pattern of the patterned multiple layer structure 21 to the substrate 10, so as to form a plurality of trenches by removing parts of the substrate 10, and to form at least one fin structure 26 in the substrate 10 between the trenches. The fin structure further comprises a plurality of first dummy fin structures 26A and a plurality of second dummy fin structures 26B, but not limited thereto. The SIT process here is similar to the SIT process mentioned above. Besides, since many etching processes are performed, at this time, or by the time the bottom layer 13 or the buffer layer 14 mentioned above is to be etched, the sail-shaped spacers 20 may have been etched away or completely removed, but not limited thereto; parts of the spacers 20 may still remain on the patterned multiple layer structures 21.

Figure 4:
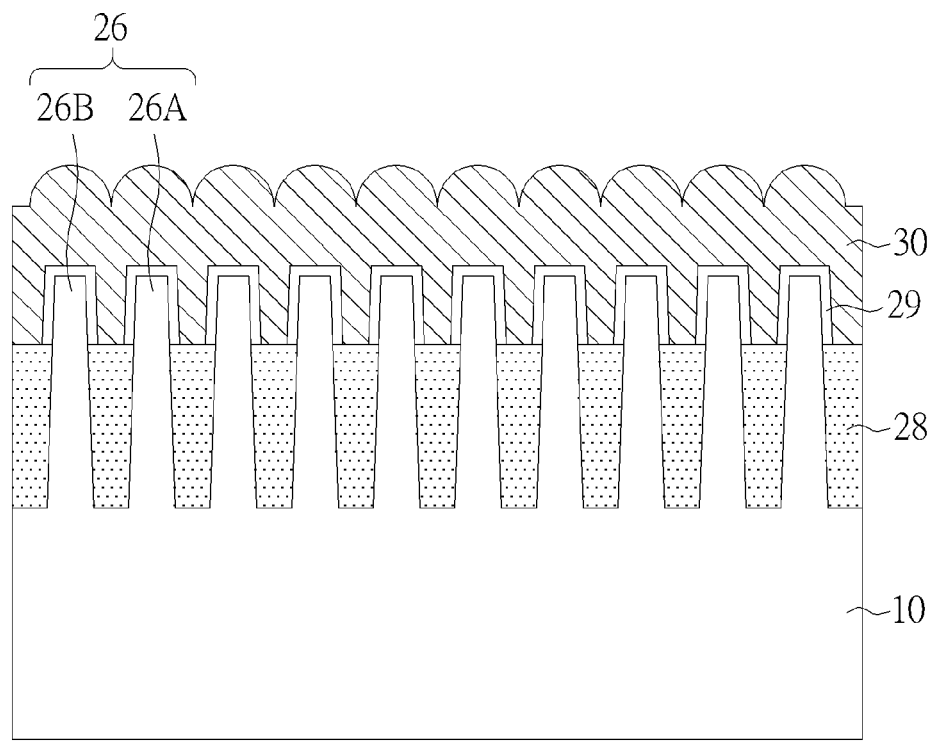

Please refer to FIG. 4; an isolating layer 28 is filled between the fin structures 26; then, a planarizing process (such as a chemical mechanical process, CMP) and an etching back process are performed in sequence to etch parts of the isolating layer 28 to allow the fin structures 26 to jut out the top surface of the isolating layer 28. A liner 29 can be selectively formed on the surface of the fin structures 26 and a cap layer 30 is then formed on the isolating layer 28 to cover each fin structure 26. The material of the isolating layer 28 mainly includes silicon oxide, the material of the liner 29 mainly includes silicon oxide and the material of the cap layer 30 mainly includes a silicon nitride, but not limited thereto.

Figure 5:
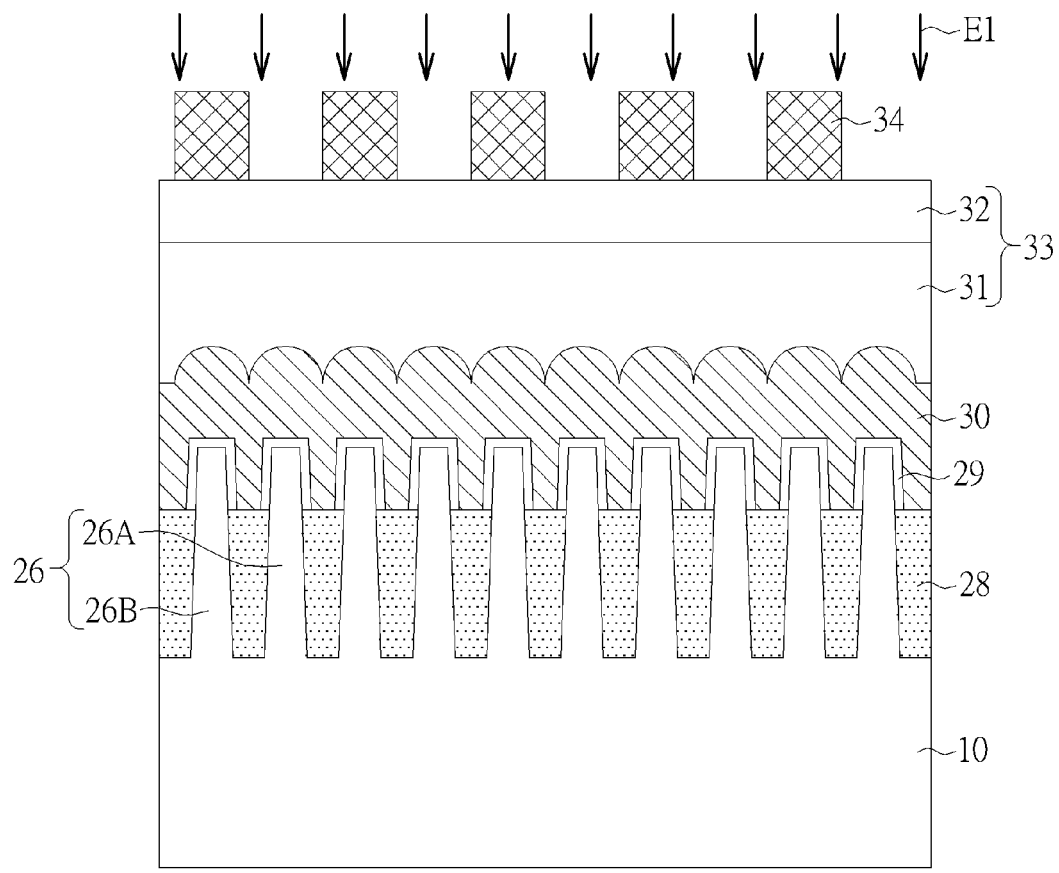

As shown in FIG. 5, a first dielectric layer 33 is formed on the cap layer 30, wherein the first dielectric layer 33 can be a single layer structure or multiple layer structure. In this embodiment, the first dielectric layer 33 includes a bottom layer 31 and a top layer 32, wherein the bottom layer 31 and the top layer 32 are made of different materials, such as silicon nitride and silicon oxide respectively, but not limited thereto. The materials can be adjusted according to the actual requirements. Then, a plurality of first patterned photoresists 34 is formed on the first dielectric layer 33, wherein each first patterned photoresist 34 is substantially disposed correspondingly to the first dummy fin structures 26A disposed below. More precisely, in this embodiment, the first dummy fin structures 26A are arranged in intervals, therefore the first patterned photoresists 34 are arranged in intervals too and one other fin structures 26 is disposed between each two first dummy fin structures 26A. In other words, if each the fin structures 26 on the substrate 10 is noted with a number, only the fin structures 26 having an odd number (or an even number) are the first dummy fin structures 26A, and the corresponding first patterned photoresist 34 is disposed above. The first patterned photoresists 34 will not be disposed correspondingly to other fin structures 26 adjacent to the first dummy fin structures 26A. In this embodiment, the width of each first patterned photoresist 34 is about 48 nanometer (nm), but not limited thereto. It is worth noting that, in this embodiment, the first patterned photoresists 34 are arranged in intervals (odd number intervals or even number intervals), but the present invention is not limited thereto; it can be adjusted according to actual requirements.

A first etching process E1 is then performed to etch the region that is not covered by the first patterned photoresist 34, including etching the first dielectric layer 33, the cap layer 30, the first dummy fin structures 26A, the isolating layer 28 and parts of the substrate 10 in sequence. More precisely, during the first etching process E1, since the first dummy fin structures 26A are arranged in odd intervals or even intervals, the amount of removed first dummy fin structures 26A is the same as the amount of the remaining fin structures 26, but the present invention is not limited thereto; the amount of remaining fin structures 26 is related to the arrangement of the first patterned photoresist 34. Since the size and the amount of the first patterned photoresist 34 can be adjusted according to actual requirements, the amount of remaining fin structures 26 can be different after the first etching process E1 has been performed in other embodiments.

Figure 6:
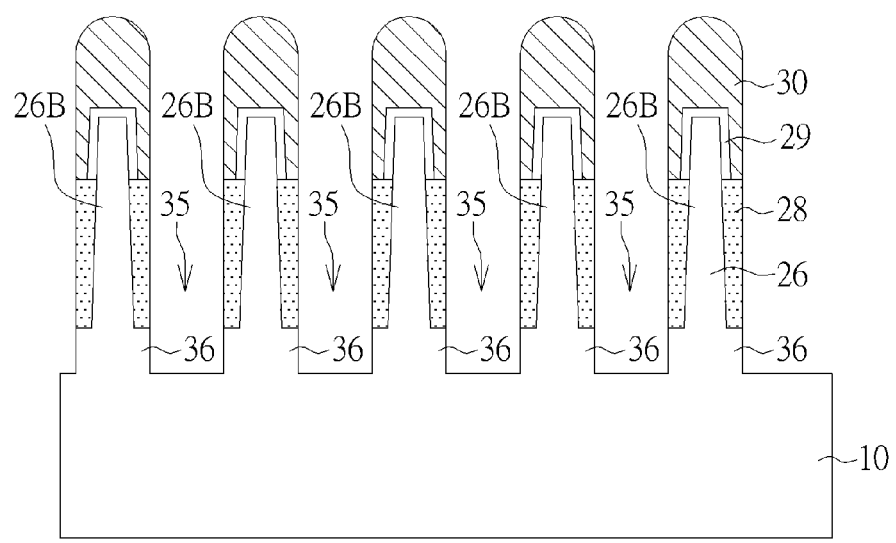

In this embodiment, after the first etching process E1 is performed, as shown in FIG. 6, since the first dummy fin structures 26A have been removed, the interval between the remaining fin structures 26 and the adjacent fin structures 26 become larger, thereby reducing the difficulty of the positioning process in the following steps. In addition, the first etching process E1 further partially removes the substrate 10 disposed below the first dummy fin structures 26A to form a plurality of trenches 35 and a short wide fin structure 36 is formed between the trenches 35 and the remaining fin structures 26 are disposed on each short wide fin structure 36. Besides, parts of the isolating layer 28 are disposed on the sidewall of the fin structures 26 and disposed on the short wide fin structure 36. It is worth noting that the sidewall of the isolating layer 28 is trimmed with the sidewall of the short wide fin structure 36.

Figure 7:
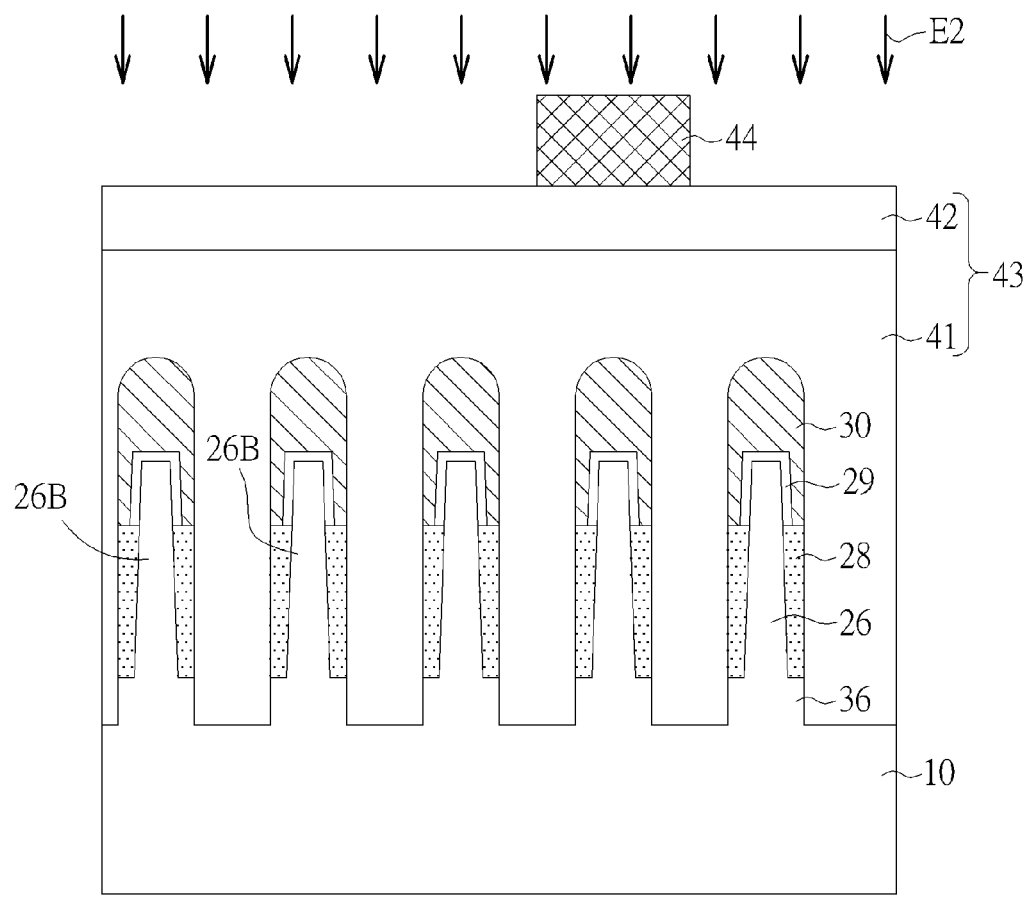

As shown in FIG. 7, a second dielectric layer 43 is formed to fill the trench 35 and cover the cap layer 30, wherein the second dielectric layer 43 can be a single layer structure or multiple layer structure. In this embodiment, the second dielectric layer 43 includes a bottom layer 41 and a top layer 42, wherein the bottom layer 41 and the top layer 42 are made of different materials, such as silicon nitride and silicon oxide respectively, but not limited thereto; the materials can be adjusted according to the actual requirements. Then, a plurality of second patterned photoresists 44 is formed on the second dielectric layer 43, wherein the second patterned photoresists 44 are disposed correspondingly to the fin structures 26 below that are predicted to remain in the following steps. The other fin structures 26 not corresponding to the second patterned photoresist 44 are defined as the second dummy fin structures 26B, which will be removed in the following steps. It is worth nothing that, the width of each second patterned photoresist 44 is preferably larger than the width of the first patterned photoresist 34 to entirely protect the fin structures 26 disposed below from unwanted damages. In this embodiment, the width of the second patterned photoresist 44 is about 86 nm, but not limited thereto; the size and the amount of the second patterned photoresist 44 can be adjusted according to the actual requirements. In addition, since the second patterned photoresists 44 are only disposed correspondingly to the fin structures 26 that are predicted to remain, the amount of second patterned photoresists 44 is less than the amount of first patterned photoresists 34 and the pattern density of the first patterned photoresists 34 is higher than a pattern density of the second patterned photoresists 44.

Figure 8:
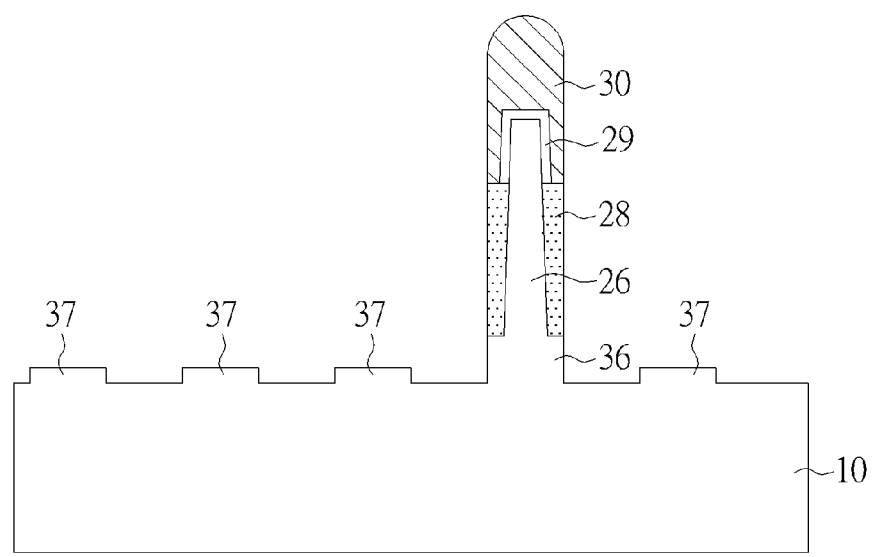

A second etching process E2 is then performed to etch the region that is not covered by the second patterned photoresist 44, including etching the second dielectric layer 43, the cap layer 30, the second dummy fin structures 26B, the isolating layer 28 and parts of the short wide fin structures 36. As shown in FIG. 8, after the second etching process E2 is performed, only the fin structures 26 disposed correspondingly to the second patterned photoresists 44 remain and the second dummy fin structures 26B are removed. It is worth noting that, in the present invention, the amount of fin structures 26 on the substrate 10 has been reduced after the first etching process E1 is performed, therefore even though the second patterned photoresists 44 are wider, it will not affect other adjacent fin structures 26 and the second patterned photoresist 44 can entirely protect the fin structures 26 disposed below. In addition, after the second etching process E2 is performed, some of the short wide fin structures 36 may not be removed completely and some portions of the short wide fin structures 36 still remain on the substrate 10, thereby forming a plurality of bumps 37 arranged in intervals on the substrate 10, but not limited thereto.

Figure 9:
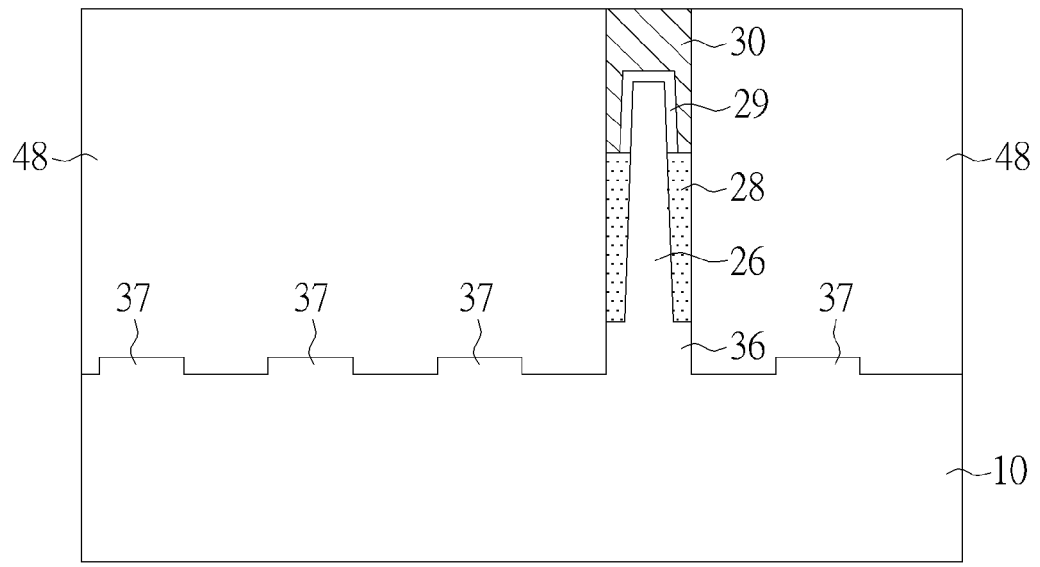
Figure 10:
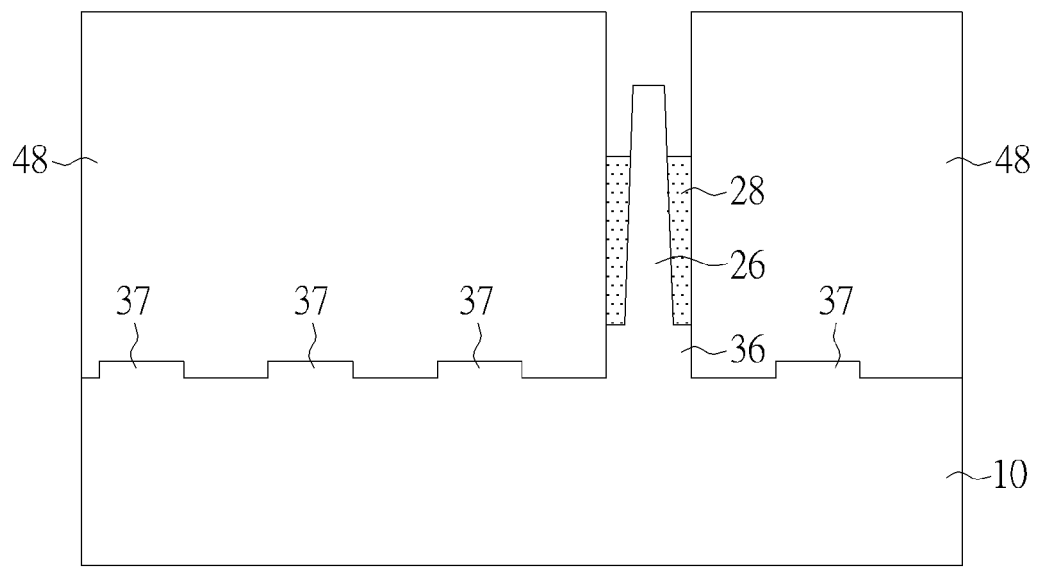

As shown in FIGS. 9~10, an isolating layer 48 is disposed on the substrate 10 and entirely covers the short wide fin structures 36, the isolating layer 28, the fin structures 26 and the cap layer 30. A planarizing process is then performed to expose the cap layer 30, and to level the top surface of the cap layer 30 with the top surface of the isolating layer 48. An etching back process is then performed to remove the cap layer 30 in the isolating layer and to expose the surface of the fin structures 26.

Figure 11:
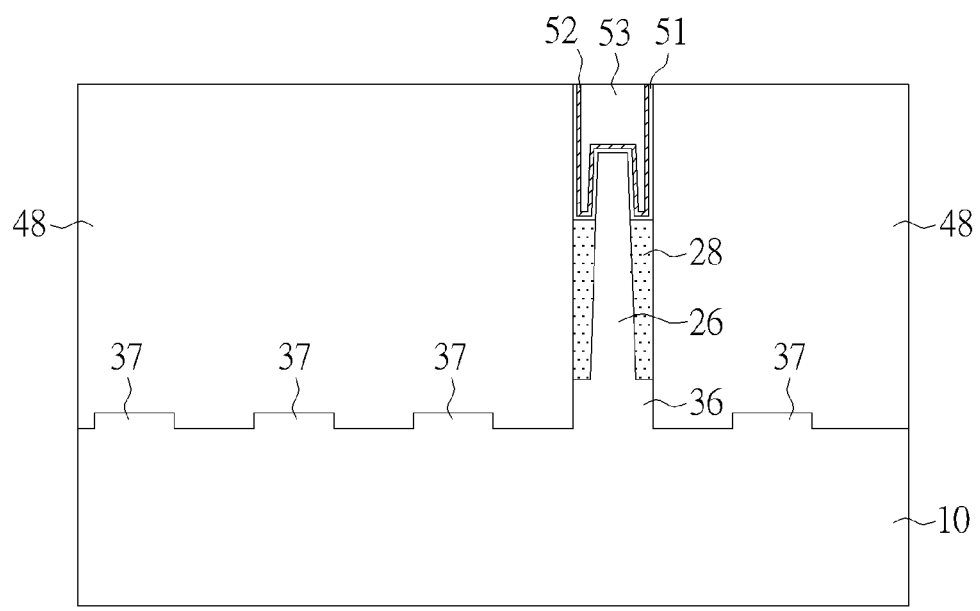

Finally, as shown in FIG. 11, a thermal oxidation process can be performed to form a barrier layer (not shown) on the surface of the fin structures 26. Then, a high-k layer 51, a work function metal layer 52 and a conductive layer 53 are formed on the fin structures 26 in sequence; a planarizing process is performed to level the top surface of the conductive layer 53 with the top surface of the isolating layer 48. The high-k layer 51, the work function metal layer 52 and the conductive layer 53 form a gate structure disposed on the fin structures 26. In this embodiment, the high-k layer 51 can be selected from the group of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$) tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). The work function metal layer 52 can be selected from the group of titanium nitride (TiN), titanium carbide (TiC), tantalum nitride (TaN), tantalum carbide (TaC), tungsten carbide (WC), titanium aluminum (TiAl) and aluminum titanium nitride (TiAlN). The conductive layer 53 manly comprises polysilicon or metals with high conductivity, such as gold, silver, copper, tungsten or the alloys thereof, but not limited thereto.

According to the method of the present invention, the final fin structures shown in FIGS. 10~11 comprise: a substrate 10, at least one fin structure 26 (it may be deemed as a long thin fin structure), at least one short wide fin structure 36 disposed between the substrate 10 and the fin structures 26, an isolating layer 48 disposed on the sidewall of the short wide fin structure 36 and an isolating layer 28 disposed between the fin structures 26 and the isolating layer 48 and disposed on the short wide fin structure 36, wherein the sidewall of the isolating layer 48 is trimmed with the sidewall of the short wide fin structure 36.

In addition, in this embodiment, the present invention further comprises a gate structure disposed on the fin structures 26, wherein the gate structure includes a high-k layer 51, a work function metal layer 52 and a conductive layer 53.

Besides, in this embodiment, the isolating layer 28 or the isolating layer 48 comprises silicon oxide or silicon nitride, but not limited thereto.

Besides, the surface of the substrate 10 is a non-planar surface; a plurality of bumps 37 are disposed on the substrate 10 and arranged in intervals. The other material properties and components are similar to those of the first preferred embodiment detailed above and will not be redundantly described.

In summary, compared with conventional processes that remove parts of the fin structures through only one photo-etching process, the method of the present invention uses two different etching processes to remove parts of the fin structures. After the first etching process is performed, the density of the fin structure on the substrate is reduced, therefore, the required fin structure can remain precisely after the second etching process is performed, thereby reducing the difficulty of the process, and avoiding spending a lot of effort on the positioning process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a fin structure, comprising the following steps:
   providing a substrate and a plurality of fin structures, a plurality of first dummy fin structures and a plurality of second dummy fin structures disposed on the substrate;
   using a first patterned photoresist as a hard mask to perform a first etching process and to remove each first dummy fin structure; and
   after the first etching process is performed, using a second patterned photoresist as a hard mask to perform a second etching process to remove each second dummy fin structure, wherein a pattern density of the first patterned photoresist is higher than a pattern density of the second patterned.

2. The method of claim 1, further comprising forming a first isolating layer on the substrate, wherein the isolating layer is disposed between the fin structures.

3. The method of claim 1, further comprising forming a cap layer on the first isolating layer that covers each fin structure.

4. The method of claim 1, further comprising forming a second isolating layer on the substrate after the second etching process is performed.

5. The method of claim 4, further comprising performing a planarizing process to the second isolating layer.

6. The method of claim 1, further comprising forming a first dielectric layer between each fin structure and the first patterned photoresist before the first etching process is performed.

7. The method of claim 6, wherein the first dielectric layer is a single layer structure or a multiple layer structure.

8. The method of claim 1, further comprising forming a second dielectric layer between each fin structure and the second patterned photoresist after the first etching process is performed and before the second etching process is performed.

9. The method of claim 8, wherein the second dielectric layer is a single layer structure or a multiple layer structure.

10. The method of claim 1, wherein the first etching process further partially etches the substrate disposed under the first dummy fin structures to form a plurality of short wide fin structures on the substrate.

11. The method of claim 10, wherein the second etching process further partially etches the short wide fin structures to form a plurality of bumps on the substrate.

12. A fin structure, comprising:
a long thin fin structure;
a short wide fin structure disposed between the long thin fin structure and a substrate;
a first isolating layer disposed on the side of the short wide fin structure; and
a second isolating layer disposed between the long thin fin structure and the first isolating layer, and disposed on the short wide fin structure.

13. The fin structure of claim 12, wherein the sidewall of the second isolating layer is trimmed with the sidewall of the short wide fin structure.

14. The fin structure of claim 12, wherein the material of the first isolating layer comprises silicon oxide or silicon nitride.

15. The fin structure of claim 12, wherein the material of the second isolating layer comprises silicon oxide or silicon nitride.

16. The fin structure of claim 12, further comprising a plurality of bumps on the substrate and arranged in interval.

* * * * *